United States Patent [19]

Elsner et al.

[11] Patent Number: 4,732,646
[45] Date of Patent: Mar. 22, 1988

[54] METHOD OF FORMING IDENTICALLY POSITIONED ALIGNMENT MARKS ON OPPOSITE SIDES OF A SEMICONDUCTOR WAFER

[75] Inventors: Gerhard Elsner, Sindelfingen; Johann Greschner, Pliezhausen; Holger Hinkel, Böblingen, all of Fed. Rep. of Germany

[73] Assignee: International Business Machines Corporation, Armonk, N.Y.

[21] Appl. No.: 26,510

[22] Filed: Mar. 17, 1987

[30] Foreign Application Priority Data

Mar. 27, 1986 [EP] European Pat. Off. ........ 86104222.4

[51] Int. Cl.$^4$ .................. H01L 21/306; B44C 1/22; C03C 15/00; C03C 25/06
[52] U.S. Cl. .................. 156/626; 156/628; 156/643; 156/653; 156/657; 156/644; 156/659.1; 156/662; 250/492.3
[58] Field of Search .............. 156/628, 643, 653, 657, 156/644, 659.1, 662, 626; 250/492.1, 492.2, 492.3; 219/121 EM, 121 LM, 121 PY; 356/138

[56] References Cited

U.S. PATENT DOCUMENTS

| | | | |
|---|---|---|---|
| 3,752,589 | 8/1973 | Kobayashi | 356/172 |
| 3,802,972 | 4/1974 | Fleischer et al. | 156/644 X |
| 4,046,985 | 9/1977 | Gates | 219/121 |
| 4,059,480 | 11/1977 | Ruh et al. | 156/644 X |
| 4,131,487 | 12/1978 | Pearce et al. | 148/1.5 |
| 4,293,374 | 10/1981 | Chaudhari et al. | 156/628 |
| 4,318,752 | 3/1982 | Tien | 148/1.5 |
| 4,338,164 | 7/1982 | Spohr | 204/4 |
| 4,369,370 | 1/1983 | Spohr | 378/160 |
| 4,534,804 | 8/1985 | Cade | 148/1.5 |

FOREIGN PATENT DOCUMENTS 3328839 2/1985 Fed. Rep. of Germany .

OTHER PUBLICATIONS

K. E. Petersen, "Silicon as a Mechanical Material", Proceedings of the IEEE, vol. 70, No. 5, May 1982, pp. 420–457.
O. Auciello, "Ion Interaction with Solids: Surface Texturing, Some Bulk Effects, and Their Possible Applications" in Journal of Vacuum Science & Technology, vol. 19, No. 4, Nov./Dec. 1981, pp. 841–867.

Primary Examiner—William A. Powell
Attorney, Agent, or Firm—Stephen J. Limanek

[57] ABSTRACT

A method of automatically forming identically positioned alignment marks on the front side and the back side of a silicon wafer especially prepared for use in silicon micromechanical technology. The front side and the back side of the silicon wafer are coated with an insulating layer. High-energy heavy ions are directed onto the front side insulating layer. The heavy ions penetrate the front side insulating layer, the wafer, and the back side insulating layer, thus forming single disturbed crystal lattice nuclear tracks in both insulating layers, with the wafer remaining undisturbed.

The nuclear tracks in both insulating layers are etched so that corresponding identically positioned pores are opened. These pores are used as alignment marks for individual further method steps.

17 Claims, 6 Drawing Figures

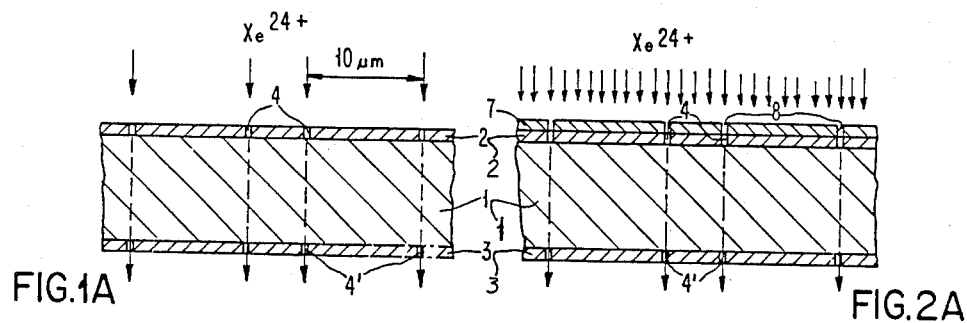
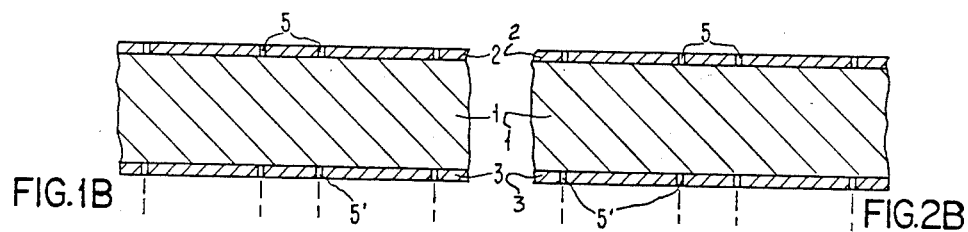
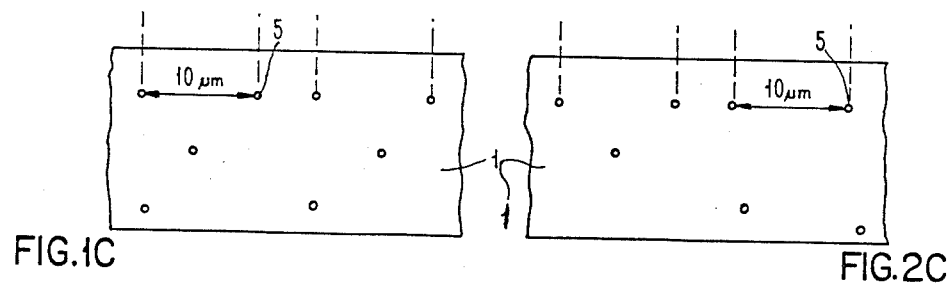

METHOD OF FORMING IDENTICALLY POSITIONED ALIGNMENT MARKS ON OPPOSITE SIDES OF A SEMICONDUCTOR WAFER

DESCRIPTION

1. Technical Field

This invention relates to a method of forming identically positioned alignment marks on opposite sides of a semiconductor wafer.

2. Background Art

Single-crystal silicon is being increasingly used in a variety of new commercial products both for its well-established electronic and excellent mechanical properties. Silicon is in the process of altering conventional perceptions of miniature mechanical devices and components.

Increasing sophistication, decreasing size, and proliferating applications of integrated electronics have been coupled with a growing demand for higher precision, higher reliability, and lower cost miniaturized mechanical components that are compatible with the electronics. Examples of such components can be found in mechanical sensors, printing technologies including ink jet print heads and thermal print heads, magnetic and optical recording heads for data storage and retrieval, solid-state laser and fiber-optic mounting, coupling, and alignment, and high-precision mechanically resonant crystals. The rapid expansion of the relatively new field of silicon micromechanics has made it possible to fabricate many such complex mechanical devices on silicon, using conventional silicon integrated circuit (IC) manufacturing processes. Numerous advantages are apparent in this approach: interfacing or integrating mechanical and electronic devices is greatly facilitated; the key factor in the cost-effectiveness of the IC industry—batch fabrication procedures—is extended to miniature mechanical components; extremely well-known and well-characterized materials and processing techniques are utilized; the rigid control of material properties, which is essential for electronic devices, can be readily applied to mechanical components to increase performance, reliability and repeatability in device characteristics; and, finally, the small dimensions and high accuracies which are commonly achieved in integrated electronics can be exploited to realize mechanical devices and structures which are not possible by any other methods.

Processing techniques, structural features, and areas of application of silicon micromechanics are described in "Proceedings of the IEEE", Vol. 70, No. 5, May 1982, pp. 420 to 457, in an article entitled, "Silicon as a Mechanical Material" by K. E. Petersen.

The problem with silicon micromechanics, when used in the manufacture of micromechanical devices, is to align both the front and the back side of a silicon wafer with high accuracy to a photolithographic mask. This problem has existed for quite a while and many proposals have been made for its solution.

U.S. Pat. No. 3,752,589, filed on Oct. 26, 1971 and issued on Aug. 14, 1973, discloses an optical-mechanical means and method for aligning the pattern of a photographic mask on one side of a wafer to a pattern on the opposite side, wherein individual optical images of the patterns on both sides of the wafer are obtained, and the position of the mask is mechanically adjusted until the two optical images are aligned.

U.S. Pat. No. 4,046,985, filed on Nov. 25, 1974 and issued on Sept. 6, 1977, discloses an optical-mechanical semiconductor wafer alignment apparatus for repeatedly aligning the back sides of wafers to the axis of a kerf-cutting laser. First, a transparent mask, having on its front side a duplicate of the device pattern and of the alignment marks on the opaque wafers, is visually aligned to the laser, and the apparatus is set to maintain this alignment. Thus, subsequently inserted opaque semiconductor wafers, having the same alignment marks, will travel through the apparatus along the same path as the transparent mask, including inversion of the wafers, so that their back sides are aligned to the laser whose beam automatically impinges on the kerf areas between the devices on the front side of the opaque wafer.

This prior art alignment apparatus requires expensive and unwieldy mechanical alignment fixtures or means. The main problem of these approaches is that they are extremely labor intensive, require a significant amount of handling, are slow and not well adaptable to automation, and cannot take advantage of modern projection printing tools.

A method of forming alignment marks on both the front and the back side of a semiconductor wafer is suggested by prior art known from U.S. Pat. Nos. 4,318,752, filed on May 16, 1980 and issued on Mar. 9, 1982, and 4,131,487, filed on Oct. 26, 1977 and issued on Dec. 26, 1978.

U.S. Pat. No. 4,318,752, filed on May 16, 1980 and issued on Mar. 9, 1982, discloses a method of forming a P-doped area in an N-doped layer of a plural-layer semiconductor body by passing a laser beam through a first P-doped layer into an adjacent N-layer which absorbs the laser beam energy and generates heat to cause diffusion of the P-doped layer into the N-doped layer. The wavelength of the laser beam is chosen such that it passes through the P-doped layer without absorption.

U.S. Pat. No. 4,131,487, filed on Oct. 26, 1977 and issued on Dec. 26, 1978, discloses a process for gettering a semiconductor wafer with a laser beam, wherein a laser beam is directed upon the back side of the wafer to create lattice damage and strain in the back side. Subsequent heating of the wafer releases the strain to attract mobile defects from the front side of the wafer to the back side.

Using these prior art laser techniques, U.S. Pat. No. 4,534,804, filed on June 14, 1984 and issued on Aug. 13, 1985, discloses a process for aligning the front and the back side of a semiconductor wafer without the need for an expensive and unwieldy alignment fixture or apparatus.

Identically positioned alignment marks on both the front and the back side of a semiconductor wafer are created by using a laser beam to scribe an alignment mark on the back side of the wafer. The wavelength of the laser beam is chosen such that it passes through the lightly doped wafer without absorption but is absorbed by a following heavily doped semiconductor layer to generate therein heat and resulting defects. The semiconductor wafer is then heated to cause the defects to migrate through the wafer to the front side where there is formed an identically positioned image of the mark scribed on the back side. This alignment process eliminates the need for a photoresist blocking mask during an etch step and makes it possible to form alignment marks on sandwich or other structures where one side is covered or otherwise inaccessible for alignment procedures.

However, with regard to the number of layers and the process steps required, this method is relatively elaborate and expensive and can only be applied to a limited extent, namely, for silicon wafers with a particular maximum doping and a particular layer sequence. The accuracy of alignment depends on the directional accuracy of the migration path of the defects to the front side.

DISCLOSURE OF THE INVENTION

It is an object of this invention to remedy the drawbacks of the prior art by forming automatically identically positioned alignment marks on the front and the back side of a semiconductor wafer. The method of this invention requires no special previous preparation of the wafers, the wafers' crystal structures are not changed, and the alignment of the alignment marks to be formed is better than 0.1 $\mu$m.

In accordance with the teachings of this invention, a method of automatically forming identically positioned alignment marks on the front side and on the back side of a silicon wafer is provided by coating the wafer with an insulating layer on one side and on the opposite side, directing high-energy heavy ions onto the one side insulating layer so that the heavy ions penetrate the one side insulating layer, the wafer and the opposite side insulating layer to form nuclear tracks in both insulating layers and etching both insulating layers so that corresponding identically positioned pores are opened in the insulating layers.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIGS. 1A and 1B are sectional views of a semiconductor wafer processed according to a first method of the present invention, wherein blanket low-dose heavy ion exposure is used to form single randomly distributed alignment marks on the front and the back side of the wafer;

FIG. 1C is a plan view of the wafer processed according to the first method of the present invention;

FIGS. 2A and 2B are sectional views of a semiconductor wafer processed according to a second method of the present invention, wherein blanket high-dose heavy ion exposure is used to form distinct alignment marks defined by a metal mask, and FIG. 2C is a plan view of the wafer processed according to the second method of the present invention.

BEST MODE FOR CARRYING OUT THE INVENTION

The method according to the invention utilizes a phenomenon which has been used for a number of years to detect the existence of fast heavy ions. For that purpose, a solid is introduced into a solid "bubble chamber" where it is bombarded with high-energy heavy ions. Along their path, the heavy ions penetrating the solid disturb the crystal lattice to such an extent that fine channels can subsequently be etched into the crystal. Each channel corresponds to a single heavy ion. The channels are marked by a dense distribution of the diameters which are substantially identical. The number of channels is effectively controlled as a function of the ion dose and independently of the diameter. The diameters of the channels produced by etching are effectively adjustable in a range from 10 nm to 100 $\mu$m. In addition, the length/diameter ratio is adjustable, and a ratio of 70 has already been realized.

This phenomenon is also covered by U.S. Pat. No. 4,369,370, filed on Dec. 22, 1980 and issued on Jan. 18, 1983, describing a method of generating microholes resulting from nuclear tracks of a single ion or a countable number of ions of an accelerator, e.g., heavy ions of a heavy-ion accelerator in solids. After exposure, the solid is subjected to an etch process wherein microholes or channels are formed.

Applications of this phenomenon are described in "Journal of Vacuum Science & Technology", Vol. 19, No. 4, November/December 1981 under the title, "Ion Interaction with Solids: Surface Texturing, Some Bulk Effects, and Their Possible Applications", on pp. 841–867. The heavy ion bombardment method is used in particular to generate single holes in membranes and to produce microfilters. By bombarding Hostaphan (polyethylene terephthalate) with 4.7 MeV Xe ions at a dose of $1.6 \times 10^7$ cm$^{-2}$, channels of about 50 $\mu$m length and 0.7 $\mu$m diameter, which produce a filter effect, are formed during etching in NaOH.

A further application of this phenomenon is described in U.S. Pat. No. 4,338,164, filed on Dec. 22, 1980 and issued on July 6, 1982, which discloses a method of producing planar surfaces with minimum peaks in the $\mu$m range or smaller, for instance, of flat field emission cathodes of conductive or semiconductive material by filling hollow spaces in matrices and subsequently removing the matrix containing the hollow spaces. The flat matrix accommodating the hollow spaces is exposed to high-energy ions, e.g., of a heavy ion accelerator. In a subsequent etch process, the nuclear tracks formed are bared. Finally, the holelike nuclear particle tracks and/or hollow spaces are filled with a conductive or a semiconductive material, thus yielding a needle structure of conductive or semiconductive material, which is used as a field emission cathode.

German Offenlegungsschrift No. 33 28 839 discloses a method, wherein the described phenomenon is used to produce a layer structure for vertical magnetic data storage. For that purpose, a carrier of a non-magnetic material, such as resin, is applied to a suitable substrate. A pattern of nuclear tracks is produced in this carrier by high-energy heavy ion bombardment. By subsequent etching, these nuclear tracks are converted into channels. In a suitable plating process, the channels are filled with the magnetic material that permits vertical magnetic data storage. Thus, a microneedle structure is obtained that comprises a plurality of needles of anisotropic material which are arranged perpendicularly to the substrate surface.

According to the invention, this known phenomenon is used in a method of forming identically positioned alignment marks on opposite sides of a semiconductor wafer.

In a first example illustrated in FIGS. 1A, 1B and 1C, a, for example, 100 $\mu$m thick wafer of silicon, of which one of the micromechanical devices described in the preamble of the description is to be produced and which because of the shape of its front and its back side is to be provided with identical alignment marks, is coated in an oxidation step known from integrated semiconductor technology with a, say, 100 nm thick silicon dioxide (SiO$_2$) layer. FIG. 1A is a sectional view of the wafer 1 with the two SiO$_2$ layers 2 and 3 on the front and the back side. In a subsequent method step, as is marked by the arrows in FIG. 1A, the front side of the wafer 1 and the SiO$_2$ layer 2, respectively, is blanket-exposed, using heavy ions at a low dose of about $10^6$–$10^7$ cm$^{-2}$. The heavy ions employed may be, for example, Xe$^{24+}$ ions with 10 MeV per nucleon. Realizing such low exposure doses is unproblematic in heavy ion technology. During exposure, each heavy ion leaves in the SiO$_2$ layer 2 in random distribution a latently disturbed crystal region and/or track 4 of about 10 nm diameter. The heavy ions also penetrate the wafer 1 which is not damaged in consequence. Each heavy ion finally penetrates the SiO$_2$ layer 3 on the back side of the wafer, where it leaves a disturbed nuclear track 4' which is accurately aligned to the disturbed track 4 in the SiO$_2$ layer 2 on the front side. At the low dose chosen, a mirror image of individual disturbed nuclear tracks 4, 4' is formed on the front and the back side of the wafer, with the spacing of adjacent tracks being, for example, of the order of 10 μm.

In the next method step, SiO$_2$ layers 2 and 3 are etched with, say, buffered hydrofluoric acid. The etchant used may also be potassium hydroxide (KOH). The etch rate in the region of the nuclear tracks 4, 4' is much higher than in the regions with undisturbed SiO$_2$, so that, as shown in the sectional view of FIG. 1B, pores 5, 5' corresponding to the disturbed tracks 4, 4', respectively, are opened in the two SiO$_2$ layers 2, 3. The diameter of the pores 5, 5' corresponds to that of the tracks 4, 4', thus being about 10 nm. During the etching of the pores 5, 5', the silicon of the wafer 1 serves as an etch stop. It is essential that the pores 5, 5' not be expanded with regard to their depth, as is known from disturbances caused by an ion collective. The accuracy of the pore alignment between the front and the back side exceeds the pore diameter.

As shown in the plan view of FIG. 1C, each characteristically positioned randomly generated partial group of pores 5, 5' in the two SiO$_2$ layers 2 and 3 may be used as an alignment mark for further masks or photoresist layers to be applied to the front and the back side, which will be required in the course of further method steps for producing a micromechanical device.

The alignment marks may also be directly applied to the surface of the wafer 1 by slightly etching the surface, using SiO$_2$ layers 2 and 3 as an etch mask. The two SiO$_2$ layers 2 and 3 are then removed and the front and the back side of the wafer 1 with the alignment marks are then directly available for further method steps to be implemented.

FIGS. 2A, 2B and 2C show a second example of the method according to the invention, the second example differing from the first only with regard to the initial method steps, so that the same reference numerals as in FIGS. 1A, 1B and 1C are used for similar parts. As shown in the sectional view of FIG. 1A, initially the front and the back side of the silicon wafer 1 is coated with an insulating layer 2, 3 of SiO$_2$. Then, a mask, say, a metal mask 7, that is impervious to heavy ions, is applied to the SiO$_2$ layer 2 on the front side of the wafer 1. This metal mask 7 has a pattern of openings 8, whose diameter and distribution reflect the alignment marks to be formed. Using this metal mask 7, the front side of the structure is exposed to high-energy heavy ions, for example, Xe$^{24+}$. As a heavy ion must be capable of impinging on the region of the individual mask windows 8, exposure must be be effected at a relatively high dose of about $10^9$ cm$^{-2}$. The energy may again be 10 MeV per nucleon. The mask windows 8 define the points at which the heavy ions penetrate the two SiO$_2$ layers 2 and 3 and the wafer 1, again leaving disturbed nuclear tracks 4, 4' only in the SiO$_2$ layers 2 and 3.

After removal of the metal mask 8, etching is effected by, say, buffered hydrofluoric acid, causing pores 5, 5', as indicated in FIG. 2B, having a diameter of about 10 nm to be opened in the SiO$_2$ layers 2 and 3 on the front and the back side of the wafer 1. The plan view of FIG. 2C shows the masked alignment mark pattern thus formed which is used in the subsequent differentiated method steps.

It is pointed out that in lieu of silicon also other semiconductor materials may be used as a wafer. As the disturbance by heavy ion exposure occurs in insulating layers, polymer or photoresist layers may, if necessary, be used in lieu of the SiO$_2$ layers on the front and the back side of the wafer.

While the invention has been particularly shown and described with reference to preferred embodiments thereof, it will be understood by those skilled in the art that various changes in form and details may be made therein without departing from the spirit and scope of the invention.

What is claimed is:

1. A method of forming identically positioned alignment marks on front and back sides of a semiconductor wafer, characterized by coating the front and the back sides of said semiconductor wafer with an insulating layer forming front and back side insulating layers, directing high-energy heavy ions onto said front side insulating layer, said heavy ions penetrating said front side insulating layer, said semiconductor wafer and said back side insulating layer, forming single disturbed crystal lattice nuclear tracks in said front and back side insulating layers, without disturbing the crystal lattice of the semiconductor wafer, and etching said nuclear tracks in said front and back side insulating layers with corresponding, identically positioned pores being opened in said front and back side insulating layers, whereby said pores provide alignment marks for individual further method steps.

2. A method as set forth in claim 1 wherein said directing step includes a blanket high-energy heavy ion exposure for said front side insulating layer at such a low dose so that randomly distributed single nuclear tracks are produced in said front and back side insulating layers.

3. A method as set forth in claim 2 wherein said heavy ion exposure dose is at about $10^6$–$10^7$ cm$^{-2}$.

4. A method as set forth in claim 1 further including coating said front side insulating layer with a metal mask having a hole pattern defining distributed single alignment marks, and directing a blanket high-energy heavy ion exposure for said metal mask at such a high dose that nuclear tracks are produced in said front and back side insulating layers corresponding to said hole pattern.

5. A method as set forth in claim 4 wherein said heavy ion exposure dose is at about $10^9$ cm$^{-2}$.

6. A method as set forth in claim 1 wherein high-energy heavy ions are $Xe^{24+}$ ions for heavy ion exposure with an energy of about 10 MeV per nucleon.

7. A method as set forth in claim 1 wherein said semiconductor wafer is made of silicon having a thickness of about 100 to 300 $\mu$m, and said insulating layers are made of silicon dioxide ($SiO_2$) having a thickness of about 100 nm.

8. A method of making alignment marks which includes
coating a semiconductor wafer to form front and back side insulating layers,
directing high-energy heavy ions through selected locations of said front side insulating layer, said wafer and said back side insulating layer so as to form nuclear sites in the selected locations of said front and back side insulating layers, and
etching said nuclear sites in said front and back side insulating layers so as to form pores therein.

9. A method of making alignment marks as set forth in claim 8 which further includes etching said semiconductor wafer through said pores.

10. A method of making alignment marks as set forth in claim 8 wherein said directing step includes a blanket high-energy heavy ion exposure at said front side insulating layer.

11. A method of making alignment marks as set forth in claim 8 wherein said heavy ions are directed at about $10^6$–$10^7$ cm$^{-2}$.

12. A method of making alignment marks as set forth in claim 8 further including forming a metal mask having a pattern of openings therein defining alignment marks and directing a blanket high-energy heavy ion exposure at said openings.

13. A method of making alignment marks as set forth in claim 12 wherein the dose of said heavy ions is at about $10^9$ cm$^{-2}$.

14. A method of making alignment marks as set forth in claim 1 wherein said high-energy heavy ions are $Xe^{24+}$ ions with an energy of about 10 MeV per nucleon.

15. A method of making alignment marks as set forth in claim 1 wherein said semiconductor wafer is made of silicon and said front and back side insulating layers are made of silicon dioxide ($SiO_2$).

16. A method of making alignment marks as set forth in claim 1 wherein said etching is performed with buffered hydrofluoric acid.

17. A method of making alignment marks as set forth in claim 1 wherein said etching is performed with potassium hydroxide (KOH).

* * * * *